(12) United States Patent
Uchida

(10) Patent No.: US 7,250,354 B2
(45) Date of Patent: Jul. 31, 2007

(54) SEMICONDUCTOR DEVICE AND METHOD FOR FABRICATING THE SAME

(75) Inventor: Hirokazu Uchida, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/220,921

(22) Filed: Sep. 8, 2005

(65) Prior Publication Data
US 2006/0049488 A1    Mar. 9, 2006

(30) Foreign Application Priority Data
Sep. 9, 2004    (JP) .............................. 2004-262398

(51) Int. Cl.
H01L 21/46    (2006.01)
H01L 21/50    (2006.01)

(52) U.S. Cl. ................ 438/460; 438/113; 257/E21.238
(58) Field of Classification Search ................ 438/106, 438/113, 114, 460, 462, 464, 465; 257/E21.238, 257/E21.499
See application file for complete search history.

(56) References Cited

U.S. PATENT DOCUMENTS

| | | | | |
|---|---|---|---|---|
| 5,128,282 A | * | 7/1992 | Ormond et al. ................ 438/68 |
| 6,276,995 B1 | * | 8/2001 | Matsuta et al. ................ 451/41 |
| 6,455,920 B2 | * | 9/2002 | Fukasawa et al. .......... 257/620 |
| 6,482,730 B1 | * | 11/2002 | Masumoto et al. ......... 438/617 |
| 6,790,709 B2 | * | 9/2004 | Dias et al. .................. 438/122 |

FOREIGN PATENT DOCUMENTS

JP    2003-060120    2/2003

* cited by examiner

Primary Examiner—Scott B. Geyer
(74) Attorney, Agent, or Firm—Rabin & Berdo, PC

(57) ABSTRACT

A semiconductor device according to the present invention includes a semiconductor substrate, which comprises a first surface on which an electrode pad is formed, and a second surface arranged at an opposite side of the first surface; an external terminal formed on the first surface of the semiconductor substrate and is electrically connected to the electrode pad; and a sealing resin which seals the first surface so that a surface of the external terminal is exposed. An outer edge of the second surface has a chamfered portion, a surface of which is inclined by substantially 45 degrees from the second surface.

14 Claims, 18 Drawing Sheets

FIG. 14
(a)
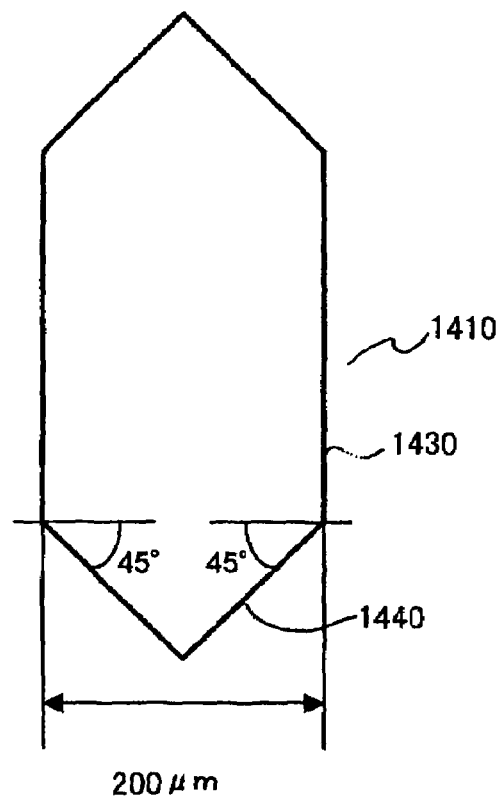
200 μm
(b)
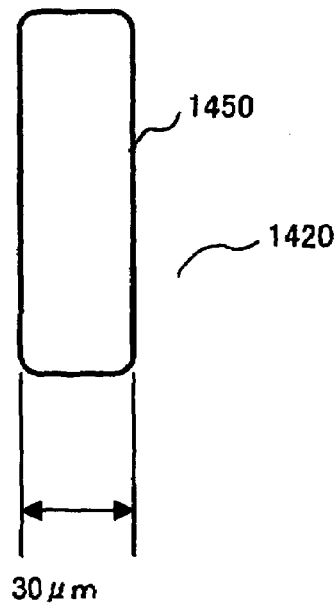
30 μm

SEMICONDUCTOR DEVICE AND METHOD FOR FABRICATING THE SAME

CROSS REFERENCE TO RELATED APPLICATION

This application claims the priority of Application No. 2004-262398, filed on Sep. 9, 2004 in Japan, the subject matter of which is incorporated herein by reference.

TECHNICAL FIELD OF THE INVENTION

The present invention relates to a semiconductor device and a method for fabricating the same. Especially, the present invention relates to a semiconductor device having an exposed rear or bottom surface and a method for fabricating the same.

BACKGROUND OF THE INVENTION

Since mobile devices are getting smaller in size, and semiconductor devices used for such mobile devices are required to be smaller in size as well. In order to achieve such a request, a semiconductor device called "chip size package", having a dimension corresponding to a semiconductor chip, has been developed. Chip size package includes a Wafer Level Chip Size Package and a Wafer Level Chip Scale Package (WCSP). A front or top surface of a semiconductor chip (semiconductor substrate) is sealed with a resin, while a rear or bottom surface, which is a silicon surface, is exposed.

A WCSP is mounted on a mount board so that a front surface of the semiconductor chip faces the mount board. In other words, a WCSP is mounted on a mount board so that a rear or bottom surface faces upward, as shown in Japanese Patent Publication No. 2003-60120A.

However, according to a WCSP described in the above publication, a rear surface of a semiconductor chip is exposed, so that an edge chipping may be occurred at an edge of the semiconductor chip when an external force is applied thereto. The edge of the semiconductor chip may be broken. When a broken piece caused by an edge chipping phenomenon is stuck on to a mount board, short-circuit would be made. Now, it has been required to prevent such an edge chipping phenomenon from a WCSP.

OBJECTS OF THE INVENTION

Accordingly, an object of the present invention is to provide a semiconductor device in which an edge chipping phenomenon hardly occurs.

Accordingly, an object of the present invention is to provide a method for fabricating a semiconductor device in which an edge chipping phenomenon hardly occurs.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a semiconductor device includes a semiconductor substrate, which comprises a first surface on which an electrode pad is formed, and a second surface arranged at an opposite side of the first surface; an external terminal formed on the first surface of the semiconductor substrate and is electrically connected to the electrode pad; and a sealing resin which seals the first surface so that a surface of the external terminal is exposed. An outer edge of the second surface has a chamfered portion, a surface of which is inclined by substantially 45 degrees from the second surface.

According to a second aspect of the present invention, a method for fabricating a semiconductor device includes: forming a groove on a second surface of a semiconductor substrate, in which the semiconductor wafer comprises a first surface on which a plurality of semiconductor devices are formed and segmented by a dicing line and a second surface arranged at an opposite side of the first surface, the groove is formed along the dicing line, the groove has a inclined surface with a first width which gets narrower toward the first surface; and dicing the semiconductor wafer along the dicing line with a dicing blade having a second width, which is narrower than the first width.

BRIEF DESCRIPTION OF THE DRAWINGS

FIG. 14 is a cross-sectional view illustrating a blade used in the first preferred embodiment.

DETAILED DISCLOSURE OF THE INVENTION

Figure 1:
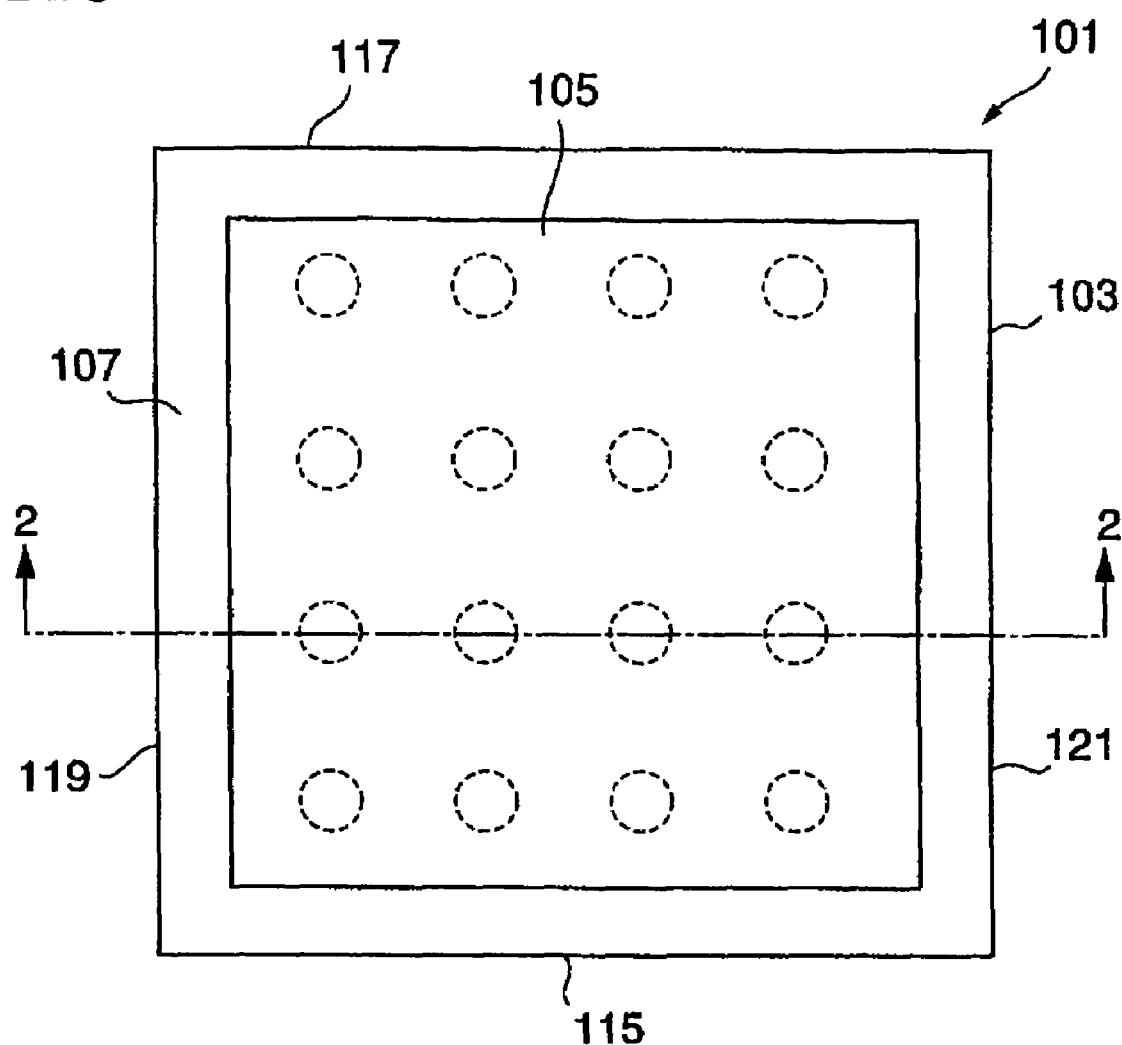
FIG. 1 is a plane perspective view illustrating a rear or bottom surface of a semiconductor device 101 according to a first preferred embodiment of the present invention.

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Now, preferred embodiments of the present invention will be described. In the attached drawings, the same or corresponded elements are represented by the same reference numerals.

Figure 2:
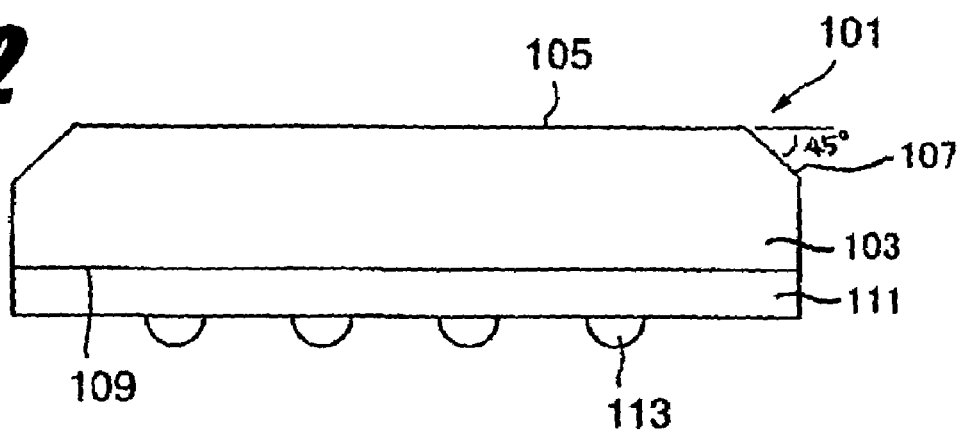
FIG. 2 is a schematic cross-sectional view taken on line 2-2 in FIG. 1.

FIG. 1 is a plane perspective view illustrating a rear or bottom surface of a semiconductor device 101 according to a first preferred embodiment of the present invention. FIG. 2 is a schematic cross-sectional view taken on line 2-2 in FIG. 1.

A semiconductor device 101 includes a semiconductor substrate 103 (semiconductor chip); a sealing resin 111 and a plurality of projected electrodes 113. As shown in FIGS. 1 and 2, the semiconductor device 101 is shaped to have the same outside dimension as the semiconductor chip 103. According to the embodiment, the semiconductor device 101 is designed, for example, to be a square of 8 mm by 8 mm.

The semiconductor substrate 103 includes a front surface (first principal surface) 109 on which a circuit element is formed; a rear surface 105 (second principal surface) provided at the opposite side of the front surface 109; and a plurality of side surfaces extending and arranged between the front surface 109 and the rear surface 105. The front surface 109 could be called an upper surface and the rear surface 105 could be called a lower surface. The semiconductor substrate 103 further includes a chamfered portion 107 formed on an edge of the rear surface 105. The chamfered portion 107 also can be called inclined portion. The chamfered portion 107, which is one of the features of the present invention, is formed along a peripheral region of the rear surface 105 surrounding a center region (inner region) thereof. In other words, the chamfered potion 107 is along first to fourth side surfaces 115, 117, 119 and 121. The first and second side surfaces 115 and 117 are opposing to each other. The third and fourth side surfaces 119 and 121 are opposing to each other. Each of the third and fourth side surfaces 119 and 121 is positioned next to the first and second side surfaces 115 and 117.

The sealing resin 111 is formed on the front surface 109 of the semiconductor substrate 103. The sealing resin 111 functions to protect circuit elements, not shown, formed on the front surface 109 from external environment. The plurality of projected electrodes 113 are formed on posts, which is not shown but arranged inside the sealing resin 111. The plurality of projected electrodes 113 are electrically connected to circuit elements on the semiconductor substrate 103 via the posts. The details of such posts will be described later. The projected electrodes 113 function as external terminals of the semiconductor device 101.

Figure 3:
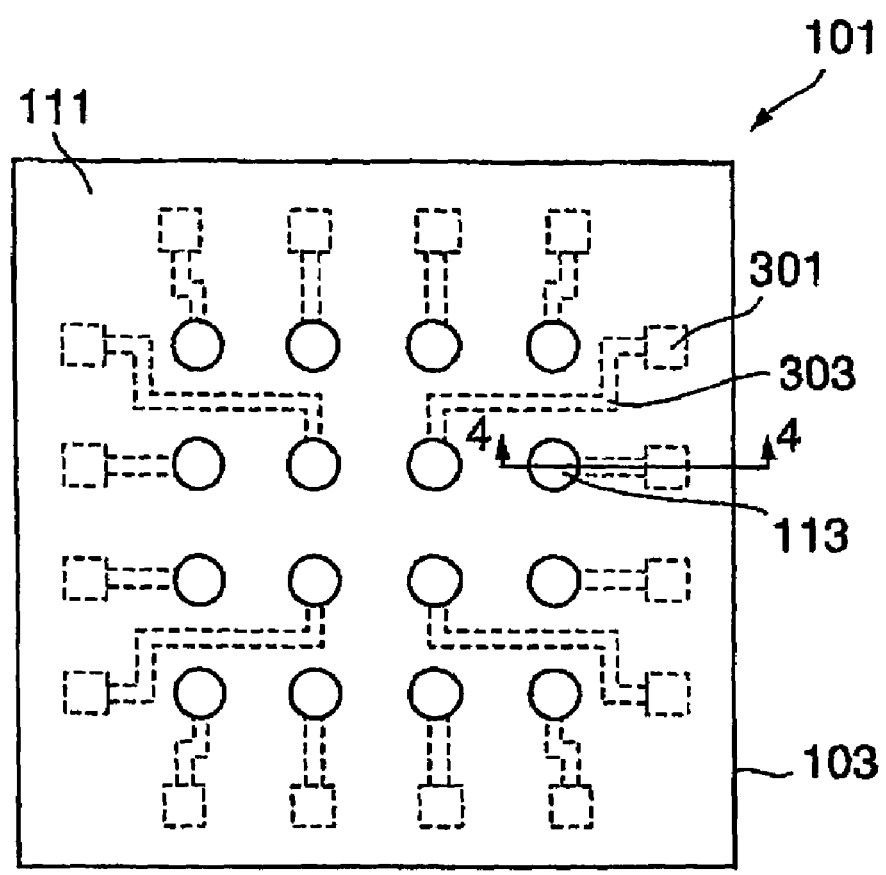
FIG. 3 is a plane perspective view illustrating a front or top surface of a semiconductor device 101 according to the first preferred embodiment.
Figure 4:
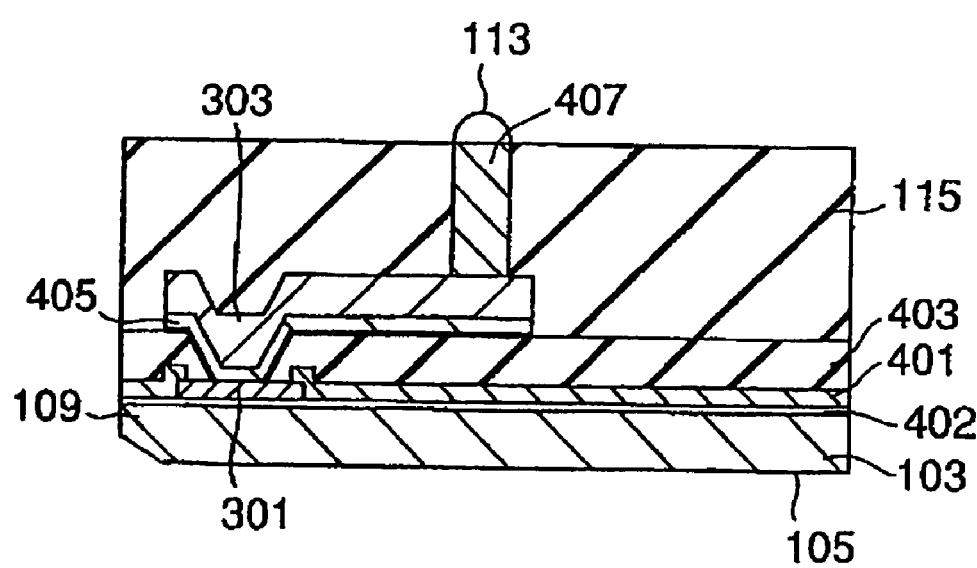
FIG. 4 is a schematic cross-sectional view taken on line 4-4 in FIG. 3.

FIG. 3 is a plane perspective view illustrating a front or top surface of a semiconductor device 101 according to the first preferred embodiment. FIG. 4 is a schematic cross-sectional view taken on line 4-4 in FIG. 3.

In FIG. 3, electrode pads 301, a metal wiring layer 303 and the projected electrodes 113 are illustrated. Since the electrode pads 301 and the metal wiring layer 303 is arranged on a layer lower than the sealing resin 111, the electrode pads 301 and the metal wiring layer 303 are illustrated by broken lines in FIG. 3.

As shown in FIG. 3, sixteen electrode pads 301 are formed with a 100 micro meters (100 μm) interval or space at a peripheral region of the tope surface 109 of the semiconductor substrate 103. Sixteen projected electrodes 113 are formed in a matrix or grid manner at a center region (inner region) of the front surface 109 of the semiconductor substrate 103. Each of the projected electrodes 113 is electrically connected to a corresponding metal wiring layer 303 via a post, not shown.

The metal wiring layer 303 functions substantially to shift a position of an external terminal from the peripheral region to the center region of the semiconductor substrate 103. In general, such position shift is called "re-positioning" or "re-arrangement", and the metal wiring layer 303 can be called "re-positioning wiring" or "re-wiring". As described above, since the projected electrodes 113 functioning as external terminals are arranged at the center region of the semiconductor substrate 103, a mount board to be connected to the semiconductor device can be smaller in size.

Next, the detailed structure of the semiconductor device 101 will be described in reference to FIG. 4.

A plurality of circuit elements, not shown, are formed on the front surface 109 (first principal surface) of the semiconductor substrate 103, which is made of silicon. The chamfered potion 107 is provided on the rear surface 105 (second principal surface) of the semiconductor substrate 103. An insulating layer 402, having contact holes, is formed on each circuit element. A conductive layer, not shown, is formed inside the contract holes.

The electrode pads 301 are formed on the insulating layer 402. The electrode pads 301 are electrically connected to circuit elements via the conductive layer formed in the contact hole. For example, the electrode pads 301 may be made of aluminum containing silicon.

An interlayer insulating film (layer) 403 is formed on a passivation layer (film) 401. The interlayer insulating film 403 reduces stress applied to the semiconductor substrate 103. The interlayer insulating film 403 may be made of polyimide. It should be noted that a surface of the interlayer insulating film 403 that is positioned directly below a metal thin-film layer 405 transmuted or deteriorated. Such transmuted region is illustrated by a bold line in FIG. 4. The transmuted region of the interlayer insulating film 403 improves adhesiveness between the interlayer insulating film 403 and the metal thin-film layer 405.

The metal thin-film layer 405 is formed on the interlayer insulating film 403 and the electrode pads 301. The metal thin-film layer 405 can be of a single layer structure or multi-layered structure. Preferably, the metal thin-film layer 405 is of a multi-layered structure, including upper and lower layers. The lower layer is made of a material which has a good adhesiveness to the electrode pads 301 and can prevent that a material including in the upper layer is diffused into the semiconductor substrate 103. Such a lower layer may be made of titanium. The upper layer is made of a material which has a good adhesiveness to the metal wiring layer 303. Such an upper layer may be made of copper.

The metal wiring layer 303 is formed on the metal thin-film layer 405. The metal wiring layer 303 may be made of copper. Posts 407 are formed on a surface of the metal wiring layer 303. According to this embodiment, the posts 407 are shaped about cylindrical or column. An rear surface of the post 407 is in contact with the surface of the metal wiring layer 303, a top end of the post 407 is in contact with the projected electrode 113. The posts 407 are made of the same material as the metal wiring layer 303 to have a height, a distance between the surface of the metal wiring layer 303 and the surface of the sealing resin 115, of 100 micro meters (100 μm).

The sealing resin 115 is formed over the upper surface 109 of the semiconductor substrate 103 entirely to cover the upper surface 109 except top ends of the posts 407. In other words, the sealing resin 115 covers the interlayer insulating film 403, the metal thin-film layer 405, the metal wiring layer 303 and side surfaces of the posts 407. An upper surface of the sealing resin 115 and the top ends of the posts 407 are arranged in the same horizontal level. The sealing resin 115 may be of an opaque epoxy resin.

The projected electrodes 113 are formed on the top ends of the posts 407. The projected electrodes 113 are electrodes to be connected to a wiring formed on a mount board, which is not shown. Circuit elements formed on the semiconductor substrate 103 are electrically connected to an external device via the metal wiring layer 303, the posts 407 and the projected electrodes 113. The projected electrodes 113 may be made of solder. Each of the projected electrodes 113 is shaped semi-sphere having a diameter of 400 micro meters (400 μm).

Next, mounting process of the semiconductor device 101 to a mount board 501 will be described in connection with FIGS. 5 and 6.

Figure 5:
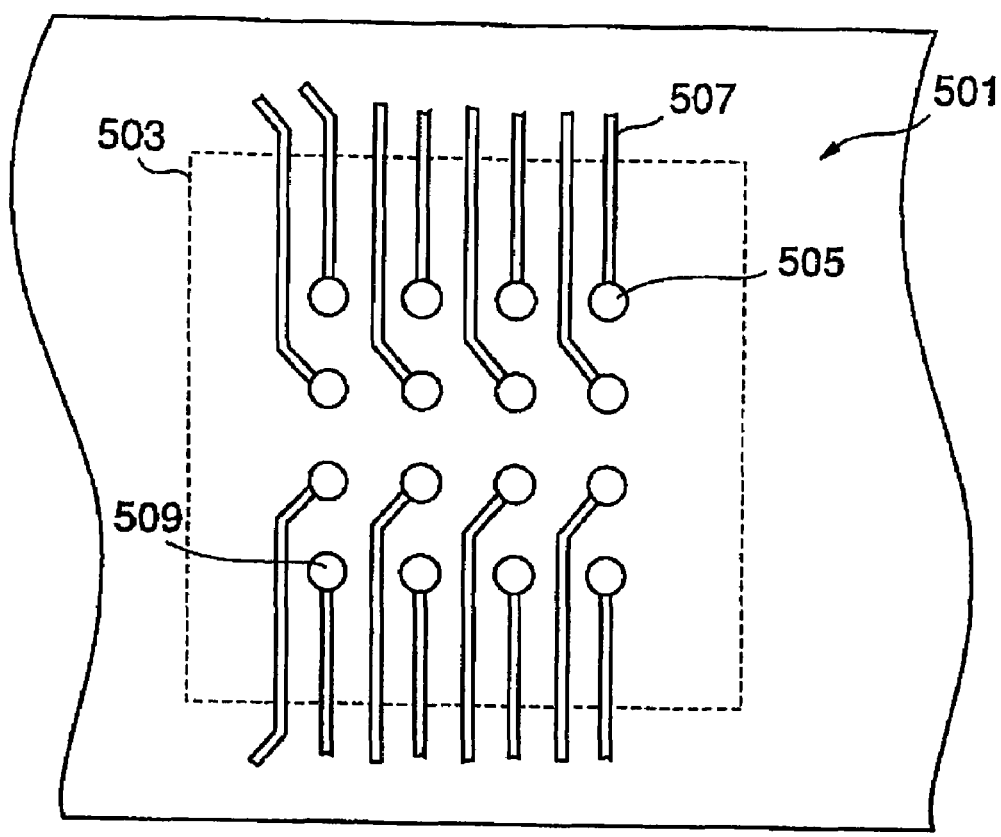
FIG. 5 is a plane view illustrating a mount board 501 on which the semiconductor device 101 according to the first preferred embodiment is to be mounted.

FIG. 5 is a plane view illustrating a mount board 501 on which the semiconductor device 101 according to the first preferred embodiment is to be mounted.

The mount board 501 includes a plurality of terminals 505, which are arranged in a matrix or grid manner at positions corresponding to the projected electrodes 113. The terminals 505 include a specific terminal 509, which is called first terminal for an address signal A1.

Each of the terminals 505 is connected to a corresponding wiring 507. The wirings 507 may be connected other devices mounted on the mount board 501. A device mounting area 503 is shown by broken line in FIG. 5. The semiconductor device 101 is to be mounted at the mounting area 503. The broken line also shows a dimension of the semiconductor device 101.

Figure 6:
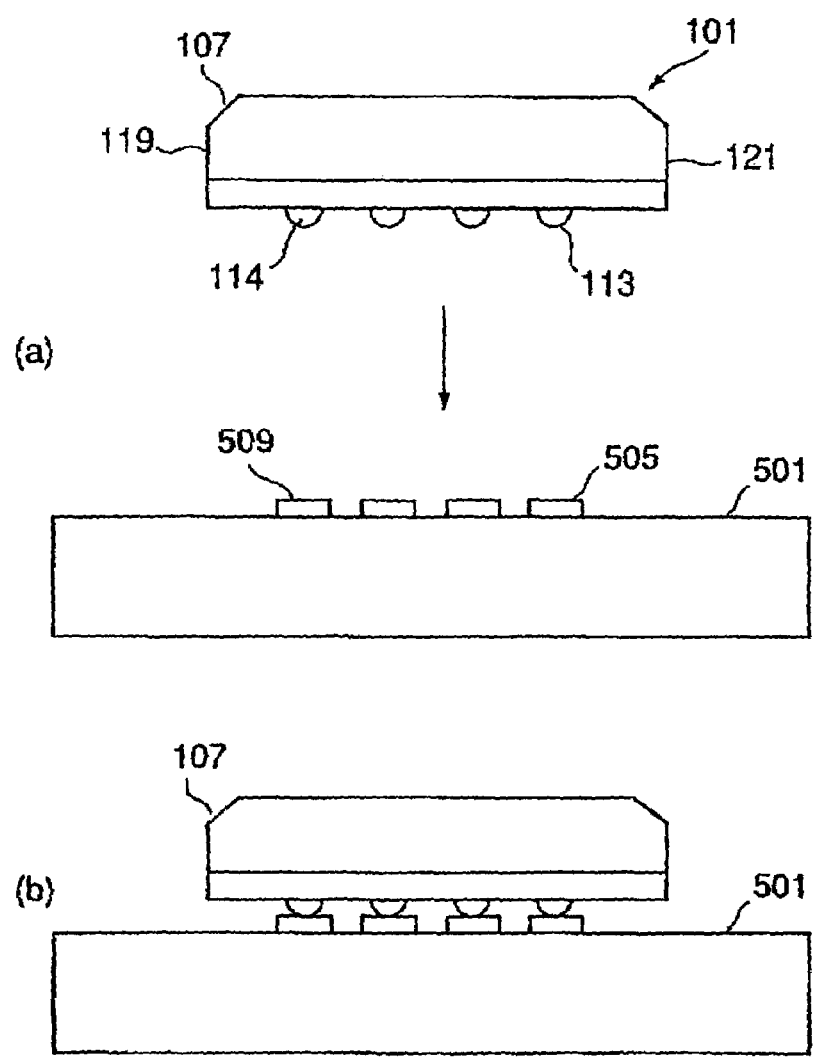
FIG. 6 shows mounting steps of the semiconductor device 101 on the mount board 501.
Figure 7:
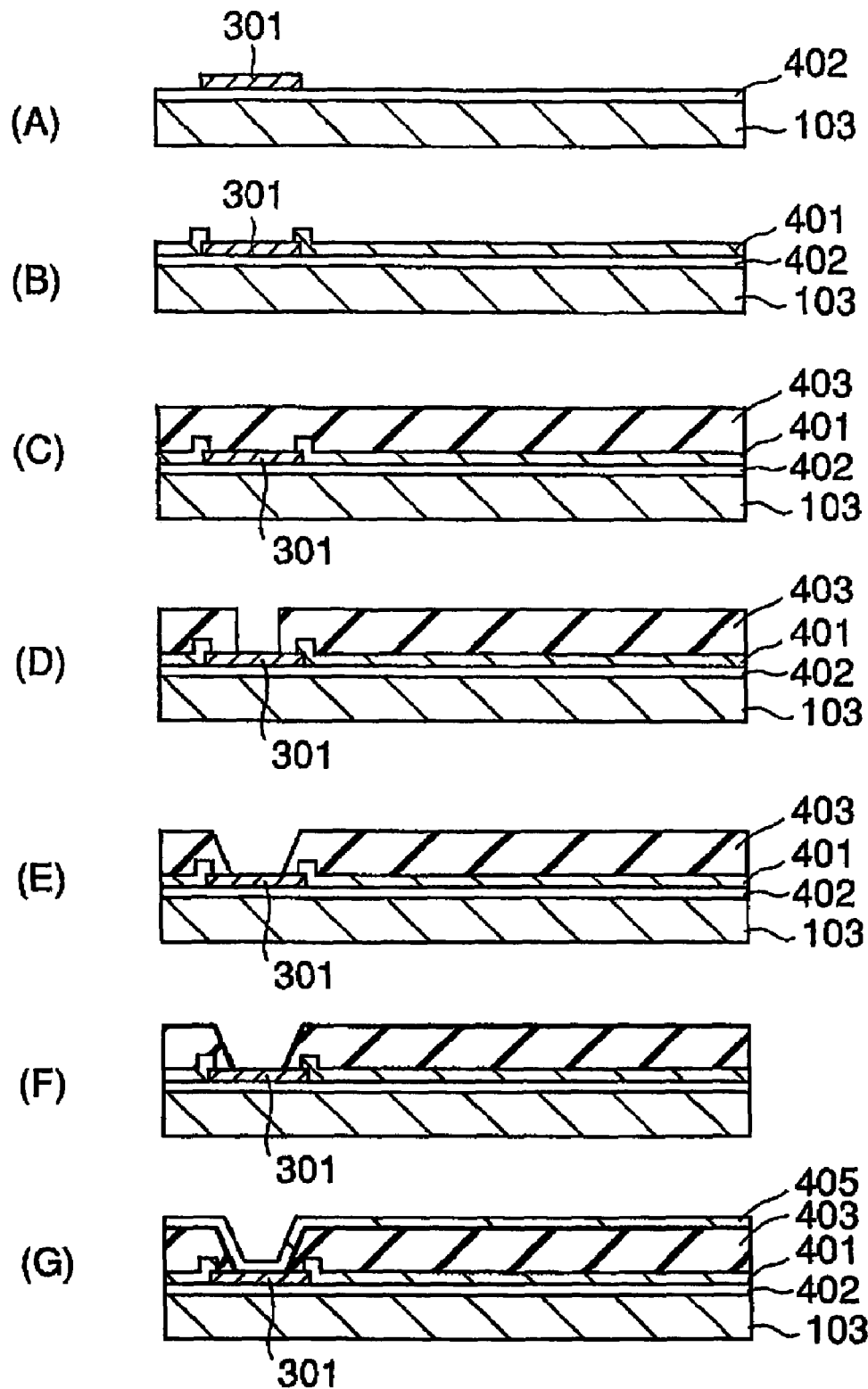
FIG. 7 shows fabricating steps of the semiconductor device 101 according to the first preferred embodiment.

FIG. 6 shows mounting steps of the semiconductor device 101 on the mount board 501.

The plurality of projected electrodes 113 of the semiconductor device 101 include a specific projected electrode 114, which is an external terminal called a first pin and is used, for example, for an address signal A1. A WCSP semiconductor device 101 would be stored once on a tape-and-reel or tray after the device is taken out of the semiconductor wafer. For the later mounting process, the semiconductor devices 101 would be equalized in direction on a tape-and-reel or tray in a certain manner. For example, the semiconductor devices 101 are stored on a tape-and-reel, so that each first pin 114 is arranged at a left lower area of the corresponding semiconductor device 101.

The semiconductor device 101 may be carried to a tape-and-reel using an auto handler with an image recognition apparatus. A first pin mark, not shown, is provided adjacent the first pin 114 on the rear surface 105. The auto handler detects and recognizes the position of the first pin mark and carries the semiconductor devices 101 to the tape-and-reel so that all first pins 114 are arranged at left lower areas of the semiconductor devices 101.

As descried above, the semiconductor device 101 is taken out of the tape-and-reel by an automatic mounting apparatus with an image recognition device. The automatic mounting apparatus recognizes directions of the semiconductor devices 101, since the automatic mounting apparatus equipping an image recognition device. As shown in FIG. 6(*a*), the semiconductor device 101 is carried above the mount board 501 by the automatic mounting apparatus. At this time, the semiconductor device 101 is arranged to face the mount board 501 so as that the first pin 114 and the first terminal 509 are directly facing each other.

Next, as shown in FIG. 6(*b*), the projected electrodes 113 of the semiconductor device 101 are connected to a plurality of terminals 505 on the mount board 501, and the mounting process is completed.

Figure 12:
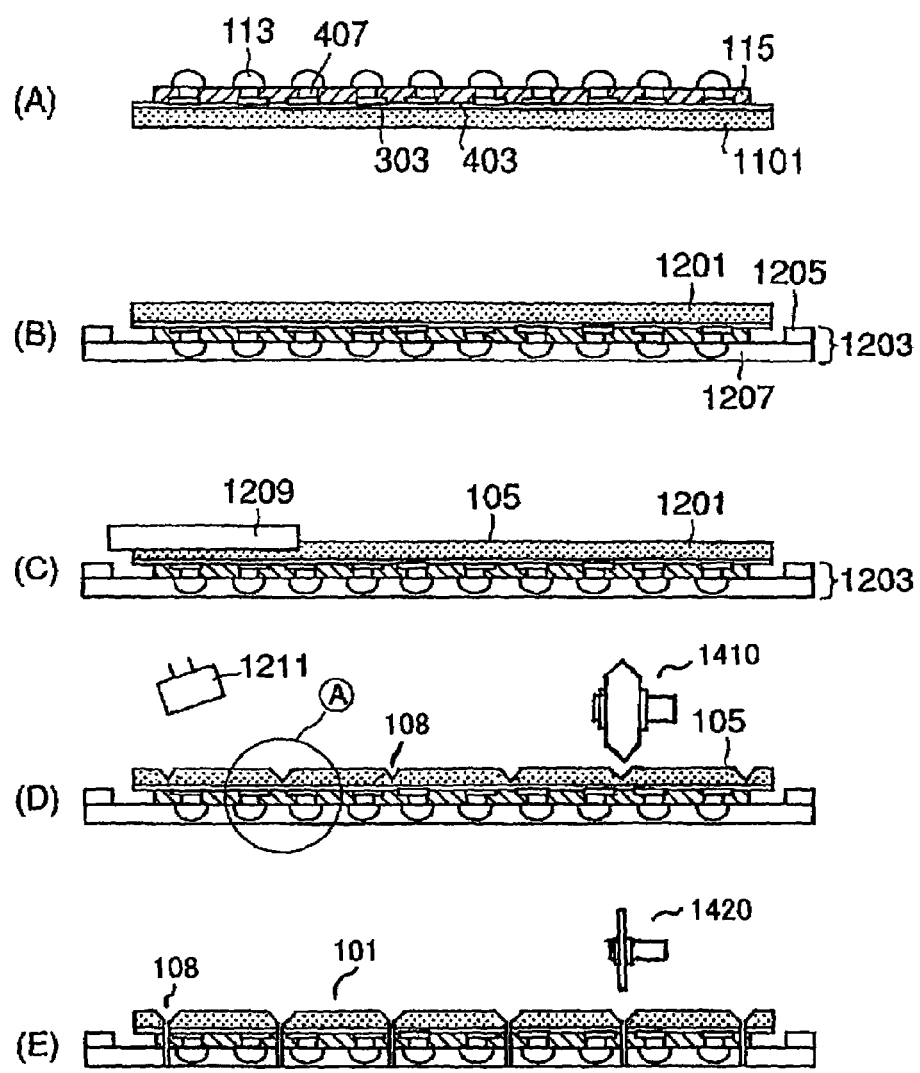
FIG. 12 shows a second process for fabricating the semiconductor device 101.
Figure 13:
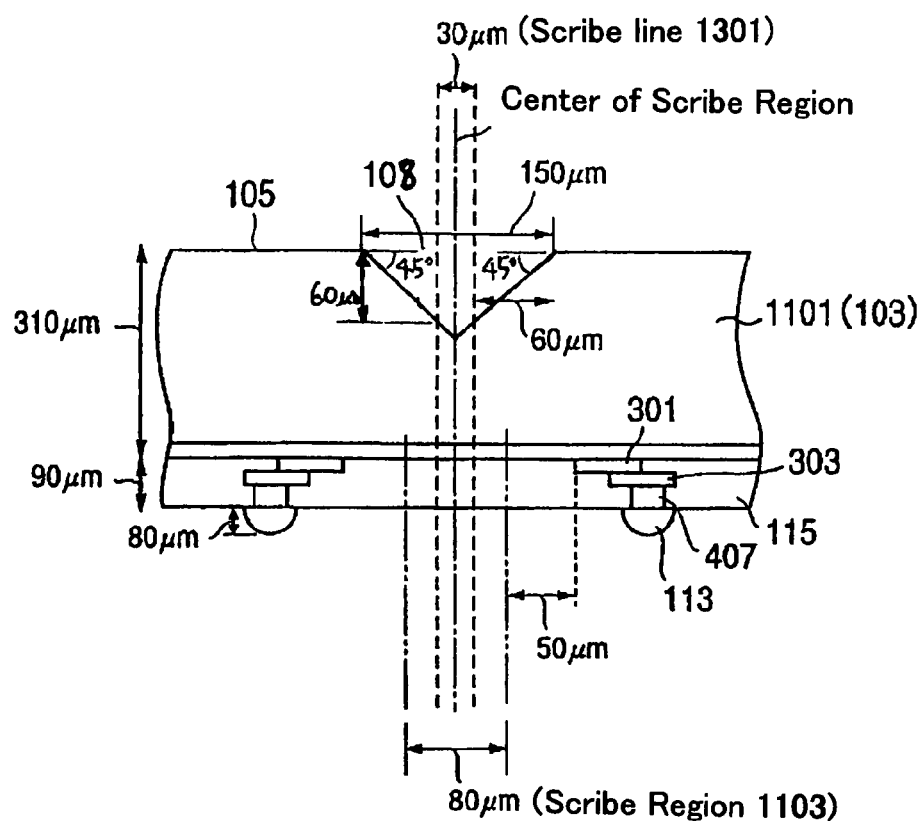
FIG. 13 is a schematic cross-sectional view corresponding to an encircled region "A" shown in FIG. 12(D).

Now, a method for fabricating a semiconductor device (101) according to a first aspect of the present invention is described. For easy understanding, the fabrication process is described by two different processes. A first process includes steps until projected electrodes 113 are formed, before a dicing process of a semiconductor wafer. The rest of the process is called a second process. The first process is illustrated in FIGS. 7 through 10, since the second process is illustrated in FIGS. 12 through 14.

For easy understanding, the first process is described only for a region taken on line 4-4 in FIG. 3.

First, a plurality of circuit elements are formed on a front surface 109 (first principal surface) of a semiconductor substrate 103, which is a semiconductor wafer. Next, an insulating layer 402 is formed on each of the circuit elements. The insulating layer is provided with contact holes therein, which is not shown. A conductive layer, not shown, is formed in the contact hole. Subsequently, an aluminum layer, containing silicon, is formed on the insulating layer 402 by a sputtering process. After that, the aluminum layer is etched to be a specific shape so that an electrode pad 301 is formed on the insulating layer 402. The electrode pad 301 is connected to the conductive layer, formed inside the insulating layer 402, as shown in FIG. 7(A).

A passivation layer 401, which is of a silicon nitride, is formed on the insulating layer 402 and the electrode pad 301 by a CVD process. After that, the passivation layer 401 positioned on a center region of the electrode pad 301 is selectively etched and removed, as shown in FIG. 7(B).

Next, an interlayer insulating layer 403, which is of polyimide, is formed on the passivation layer 401 and the electrode pad 301, as shown in FIG. 7(C). Next, the interlayer insulating layer 403 positioned on a center region of the electrode pad 301 is selectively etched and removed, as shown in FIG. 7(D).

Subsequently, the interlayer insulating layer 403, which is made of polyimide, is heated for thermosetting. As shown in FIG. 7(E), the drawing, the interlayer insulating layer 403 positioned above the electrode pad 301 is tapered to have an inclined region by the thermosetting process. If some polyimide is remained on the electrode pad 301, the remained polyimide is removed by a plasma etching process in oxygen atmosphere (FIG. 7(E)).

A plasma etching process is applied to the interlayer insulating layer 403 in an inert gas, such as argon, so as to transmute a surface of the interlayer insulating layer 403, as shown in FIG. 7(F). The transmuted surface is shown by a bold line in the drawings. The transmuted surface improves adhesiveness with a metal thin-film 405 (FIG. 7(F)). The metal thin-film layer 405 is formed on the interlayer insulating layer 403 and the electrode pad 301 by a sputtering process, as shown in FIG. 7(G).

Next, a resist 801 is formed on the metal thin-film layer 405 to have a thickness, for example, of 10 micro meters (10 μm). After that, the resist 801 is selectively removed by an etching process, as shown in FIG. 8(A).

Subsequently, a metal wiring layer 303 is selectively formed on an exposed region of the metal thin-film layer 405 by an electro plating process, as shown in FIG. 8(B). The metal wiring layer 303 has a thickness, for example, of 5 micro meters (5 μm) which is thinner than that of the resist 801.

Figure 8:
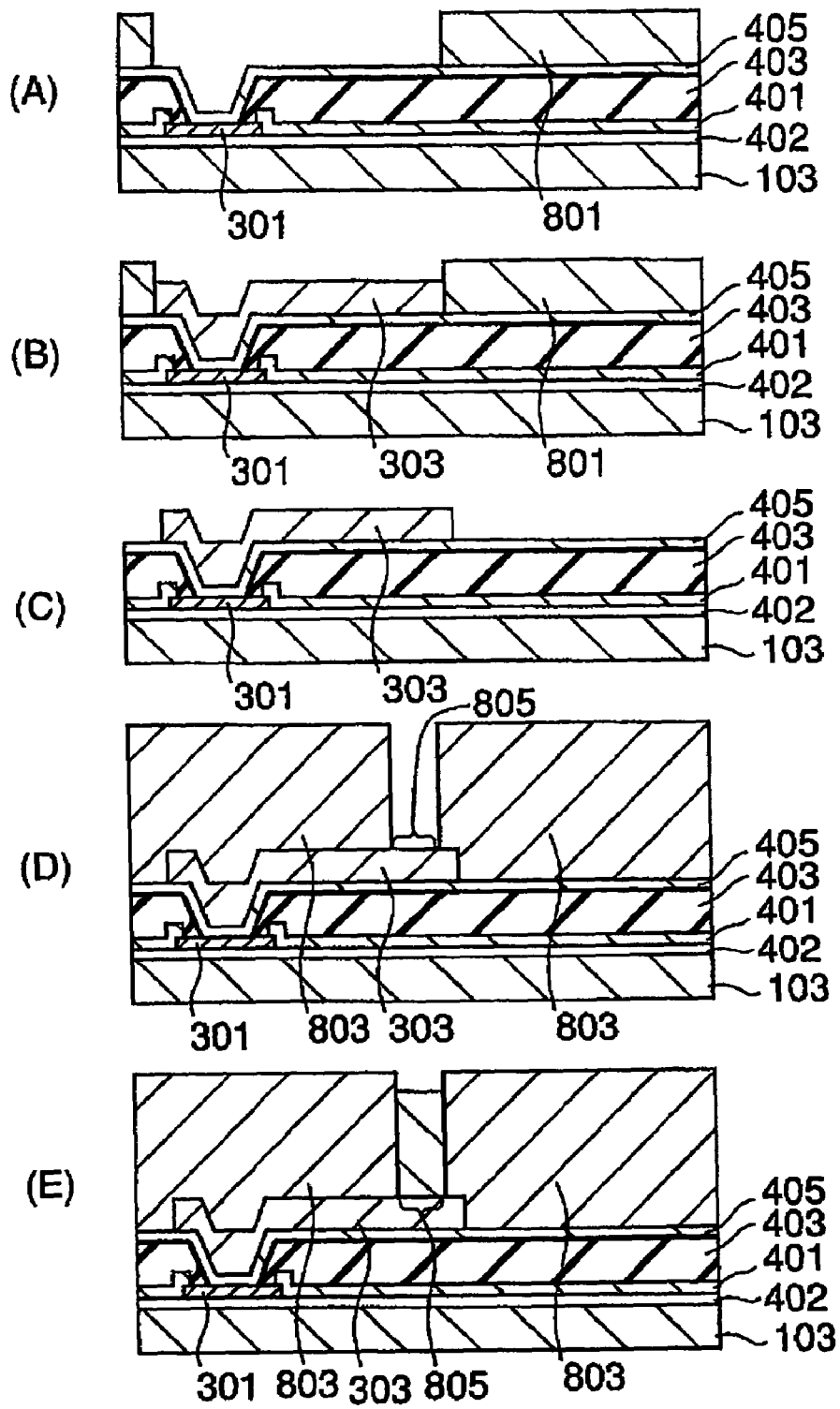
FIG. 8 shows fabricating steps of the semiconductor device 101 according to the first preferred embodiment.
Figure 9:
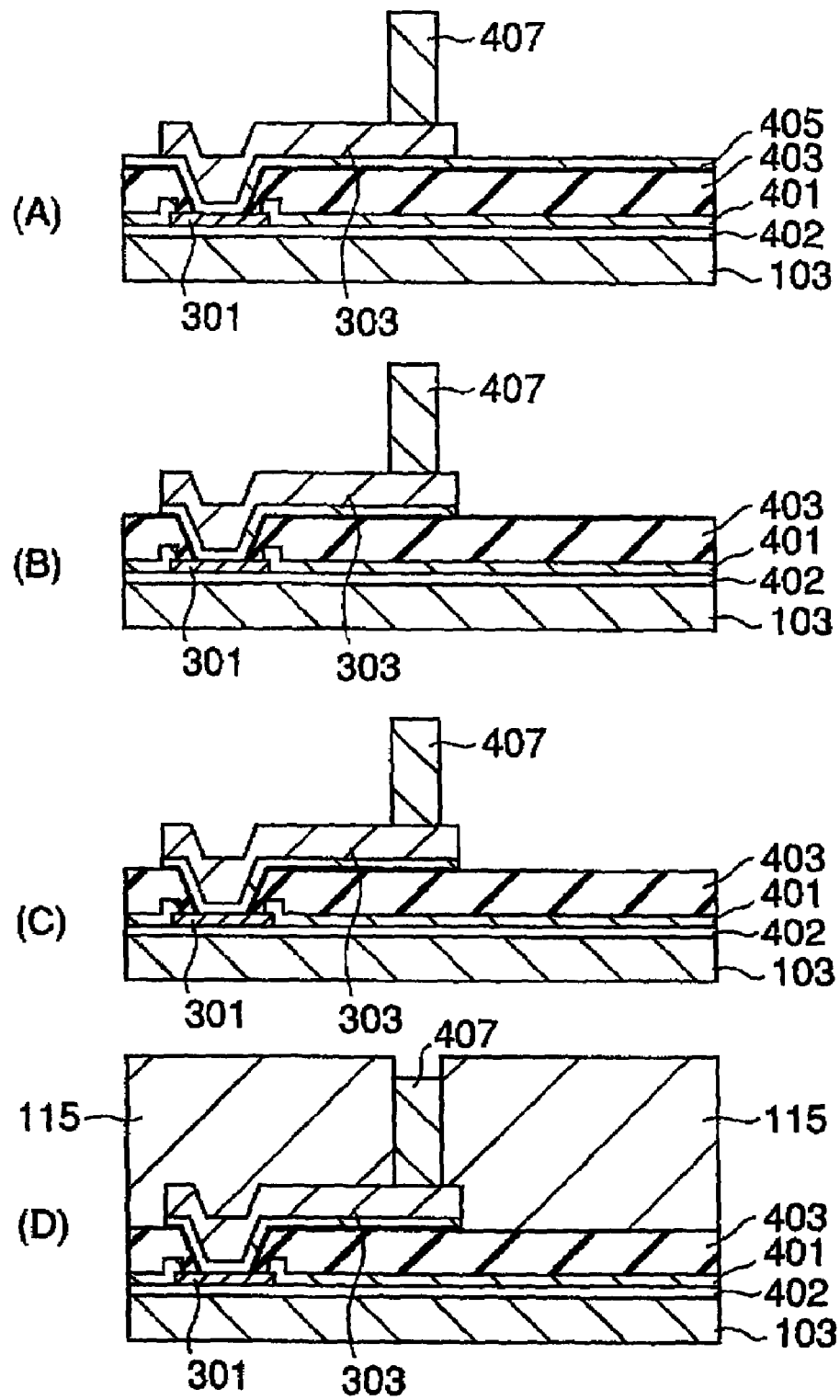
FIG. 9 shows fabricating steps of the semiconductor device 101 according to the first preferred embodiment.

Next, the resist 801 is removed using a peeling agent, such as acetone, as shown in FIG. 8(C). Next, another resist 803 having a thickness of about 120 micro meters (120 μm) is formed on the metal thin-film layer 405 and the metal wiring layer 303, as shown in FIG. 8 (D). After that, the resist 803 is selectively removed from an area above a post forming region 805, as shown in FIG. 8(D).

Subsequently, a post 407 is formed in the post forming region 805 by an electro plating process, as shown in FIG. 8(E). The post 407 has a thickness of about 100 micro meters (100 μm), which is thinner than that of the resist 803. The post 407 may be made of the same material as that metal wiring layer 303, so that the same plating solution used for forming the metal wiring layer 303 could be used for forming the post 407.

Next, the resist 803 is removed using a peeling agent, as shown in FIG. 9(A). Next, an exposed portion of the metal thin-film layer 405 is removed by a plasma etching process in an oxygen atmosphere, as shown in FIG. 9(B). After that, an exposed surface of the interlayer insulating layer 403 is removed by a wet etching process, as shown in FIG. 9(C), so that it is prevented that an electric current flowing through a metal wiring layer (303) is leaked to another metal wiring layer (303) via the surface of the interlayer insulating layer 403.

Next, the whole semiconductor wafer is set in a sealing mold (die), which is not shown, then a sealing resin is injected into the mold, so that a sealing resin 115 is formed on a upper surface 109 of the semiconductor substrate 103, as shown in FIG. 9(D). The sealing resin 115 covers the interlayer insulating layer 403, the metal thin-film layer 405, the metal wiring layer 303 and a side surface of the post 407.

Subsequently, a surface of the sealing resin 115 is polished to expose an upper surface of the post 407. The upper surface of the post 407 and the surface of the sealing resin 115 are in the same horizontal level (the same plane).

Figure 10:
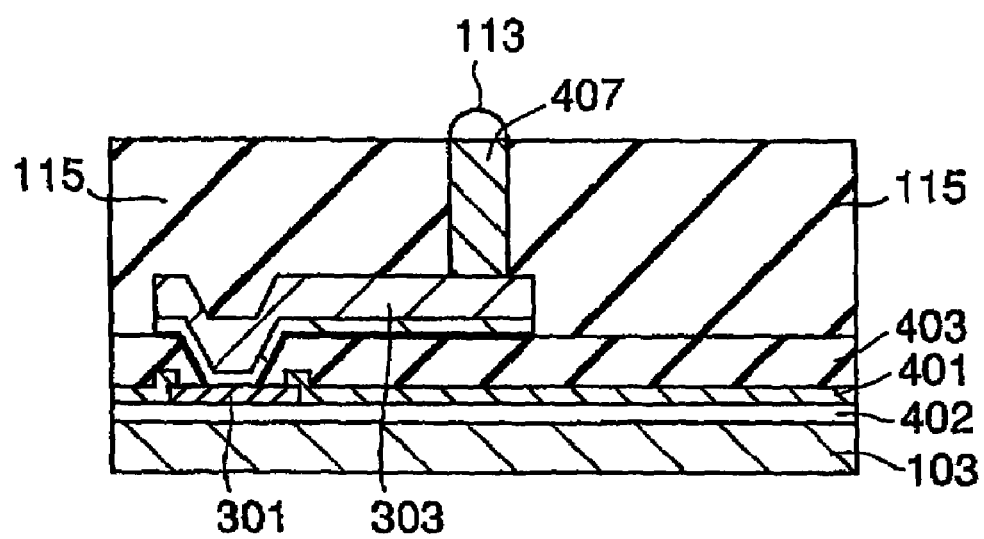
FIG. 10 shows a first step for fabricating the semiconductor device 101.

Next, a projected electrode 113 is formed on the upper surface of the post 407 by a screen printing process, as shown in FIG. 10. The projected electrode 113 is shaped semi-sphere having a diameter of 400 micro meters (μm).

Figure 11:
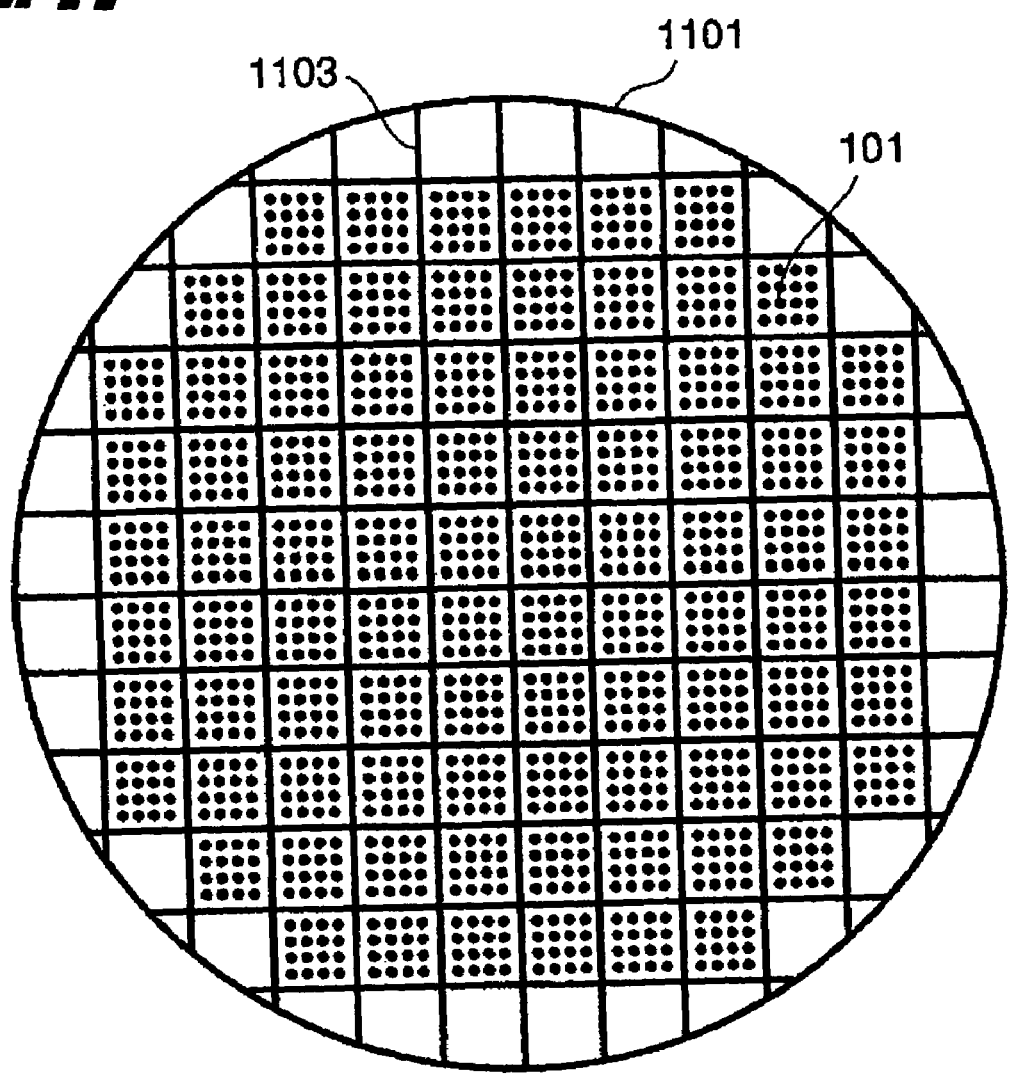
FIG. 11 is a plane view illustrating a front surface of a semiconductor wafer 1101.

An upper surface of the above-processed semiconductor wafer 1101 is shown in FIG. 11. A plurality of semiconductor devices 101, which are to be diced and separated in the second process, are formed on the semiconductor wafer 1101. The semiconductor devices 101 are segmented and separated from each other by a plurality of scribe regions 1103. At this stage, chamfered portions 107 have not been formed on the semiconductor devices 101, and a bottom (lower) surface of the semiconductor wafer is not shown here.

Now, the second process following the above-described first process is described in connection with FIG. 12. FIG. 12 shows the second process for fabricating the semiconductor device 101. For easy understanding of the present invention, some regions and components are omitted in FIG. 12.

FIG. 12(A) shows an intermediate product after the first process, shown in FIGS. 7 to 10. As shown in FIG. 12(A), the interlayer insulating layer 403, the metal wiring layer 303, the posts 407 and projected electrodes 113 are formed on the semiconductor wafer 1101.

A wafer holder 1203, having a wafer ring 1205 and a dicing sheet 1207, is prepared. The wafer ring 1205 is shaped to be circle and ring. For example, the dicing sheet 1207 may be a UV tape, having a characteristic in which an adhesive strength would be lowered when ultraviolet rays is irradiated thereto. The semiconductor wafer 1101 is adhered onto the dicing sheet 1027 so that the projected electrodes 113 are in contact with the dicing sheet 1207, as shown in FIG. 12(B).

Next, the wafer holder 1203 is mounted on a grinder having a pair of diamond grindstones 1209, as shown in FIG. 12(C). A first diamond grindstone has a roughness of #325 and a second diamond grindstone 1209 has a roughness of #2000. A bottom or lower surface of the semiconductor wafer 1101 is grinded or polished as follows: Firstly, the rear surface of the semiconductor wafer 1101 is roughly grinded with the first diamond grindstone, and then is finely grinded with the second diamond grindstone 1209. The semiconductor wafer 1101 is grinded until the wafer 1101 has a thickness of about 310 micro meters (μm).

The rear surface of the semiconductor wafer 1101 is polished with the second diamond grindstone 1209 so that the rear surface becomes in a condition of mirror finish. The rear surface of the semiconductor wafer 1101 is required to be polished finely. That is because, if the rear surface of the semiconductor wafer 1101 is not fine enough and rough, it would be difficult that the scribe regions are detected by an infrared camera.

Next, the semiconductor wafer 1101 with the wafer ring 1203 is mounted on a dual dicing apparatus equipped with an infrared camera 1211, as shown in FIG. 12(D). The dual dicing apparatus, which is not shown in the drawings, is provided with a couple of blades arranged in parallel to each other. First and second blades 1410 and 1420 used in this embodiment are illustrated in FIGS. 14(a) and (b), respectively.

The first blade 1410 includes an inclined surface 1440 and a side surface 1430. The inclined surface 1440 extends continuously from the side surface 1430 to be inclined substantially 45 degrees from a horizontal line. The first blade 1410 is shaped to have a width of 200 micro meters (200 μm). The width can be said a distance between the opposing two side surfaces 1430. The width of the first blade 1410 can be changed, for example, of 100 to 300 micro meters (100-300 μm) in accordance with a depth of groove to form. The inclined surface 1440 has a roughness of #2000.

The second blade 1420 is shaped to have a cross section of about square or rectangular and a width of 30 micro meters (30 μm). The width can be said a distance between opposing two side surfaces 1450. The width of the second blade 1420 can be changed, for example, of 30 to 50 micro meters (30-50 μm). The second blade 1420 may have a roughness of #2000.

FIG. 13 is a schematic cross-sectional view corresponding to an encircled region "A" shown in FIG. 12(D). A width of the scribe region 1103 is determined to be about 80 micro meters (80 μm). A distance between an edge of the scribe region 1103 and an edge of the electrode pad 301 is determined to be about 50 micro meters (50 μm). A scribe line 1301 has a width of 30 micro meters (30 μm), which is almost the same as the width of the second blade 1420.

In the process shown in FIG. 12(D), a V-shape groove 108 is formed within a range of 150 micro meters (150 μm), including the center lined of the scribe region 1103. The V-shape groove 108 formed on the rear surface 105 of the semiconductor wafer 1101 has a width of about 150 micro meters (150 μm), which is narrower than the width of the first blade 1410, and a depth of about 75 micro meters (75 μm). The V-shape grooves 108 are formed with the inclined surface 1440 of the first blade 1410. The side surfaces 1140 of the first blade 1410 are not used to form the V-shape grooves 105. The shape of the groove 108 corresponds to the shape of the inclined surfaces 1440 of the first blade 1410, shown in FIG. 14(a). Each of the V-shape grooves 108 has an inner inclined surface, which is inclined by substantially 45 degrees from the rear surface 105 of the semiconductor wafer 1101. The interior angle of the V-shape grooves 108 may have an error of ±5 degrees from the optimum designed value of 45 degrees due to manufacturing tolerance or margin of the blade and a cutting error.

As shown in FIG. 12(D), the pattern shape of the plurality of electrode pads 301 or the metal wiring layer 303, formed on the upper surface of the semiconductor wafer 1101 is detected and recognized from the rear surface of the semiconductor wafer 1101 by the infrared camera 1211. The dicing apparatus recognizes the position of the scribe regions 1103 formed on the upper surface 109 of the semiconductor wafer 1101.

Next, the first blade 1410 is arranged above the center line of the scribe region 1103. After that, the rear surface 105 of the semiconductor wafer 1101 is grinded by about 150 to form the V-shape grooves 108, as shown in FIG. 13. Such a grinding process with the first blade 1410 is carried out to all of the scribe regions 1103. In other words, the grinding process with the first blade 1410 is carried out to every four sides of each of the semiconductor devices 101.

Figure 15:
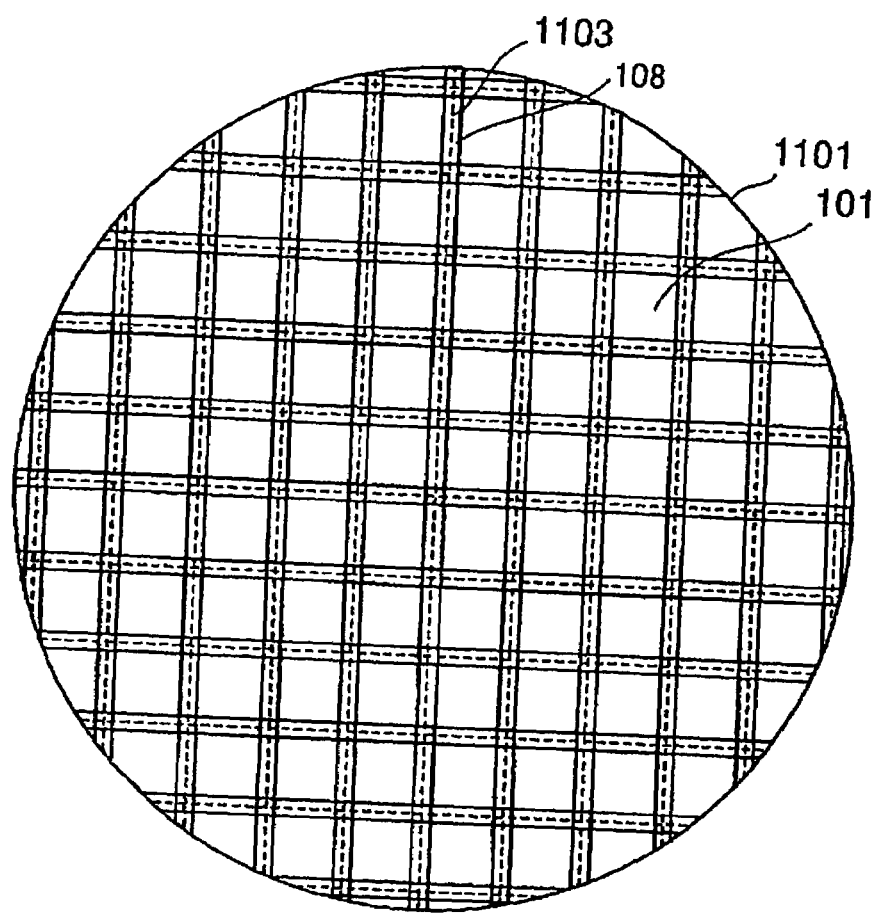
FIG. 15 is a rear surface of the semiconductor wafer 1101, corresponding to the step shown in FIG. 12(D).

FIG. 15 is a rear surface of the semiconductor wafer 1101, corresponding to the step shown in FIG. 12(D). It can be understood from FIG. 15 that a chamfered portion 107 is formed at every four sides of the semiconductor device 101 using the first blade 1410.

Next, the second blade 1420 is positioned above the center line of a scribe region 1103, that is the scribe line 1301. After that, the rear surface 105 of the semiconductor wafer 1101 is grinded with the second blade 1420 along the scribe line 1301 by a depth of 400 micro meters (400 μm). In other words, a full cutting process is carried out to the semiconductor wafer 1101. The grinding process with the second blade 1420 is carried out to every semiconductor devices 1101 to separate the semiconductor devices 101 from each other, as shown in FIG. 12(E).

Next, the semiconductor wafer 1101 with the dicing sheet 1207 is transferred to an expand-ring. After that, the dicing sheet 1207 is exposed to an ultraviolet ray to decrease its adhesiveness. The dicing sheet 1207 is expanded toward the outer edge of the semiconductor wafer, and each semiconductor device 101 is taken out by a collet.

According to the above described processes, the semiconductor device 101, shown in FIGS. 1 and 2, is completed.

The present invention includes features not only on a semiconductor device itself but also on a fabrication method. According to the present invention, the V-shape grooves 108 are formed before each semiconductor device 101 is separated from the other semiconductor devices. The semiconductor device 101 having the chamfered portion 107 can be easily fabricated by adding a process of forming the V-shape groove 108 with the first blade.

According to the present embodiment, as shown in FIG. 13, the chamfered portion 107 has a depth of 60 micro meters (60 mμ) in a direction parallel to a thickness direction of the semiconductor device 101. If the depth of the chamfered portion 107 is too much, circuit elements formed on the front surface 109 of the semiconductor chip 103 may would be affected negatively. On the other hand, if the depth of the chamfered portion 107 is not deep enough, an edge chipping phenomenon could not be prevented effectively. For those reasons, the depth of the chamfered portion 107 is preferably determined in a range of 50 to 150 micro meters (50-150 μm). The depth of the chamfered portion 107 is preferably determined in a range of 15% to 45% of the thickness of the semiconductor wafer 1101.

Figure 16:
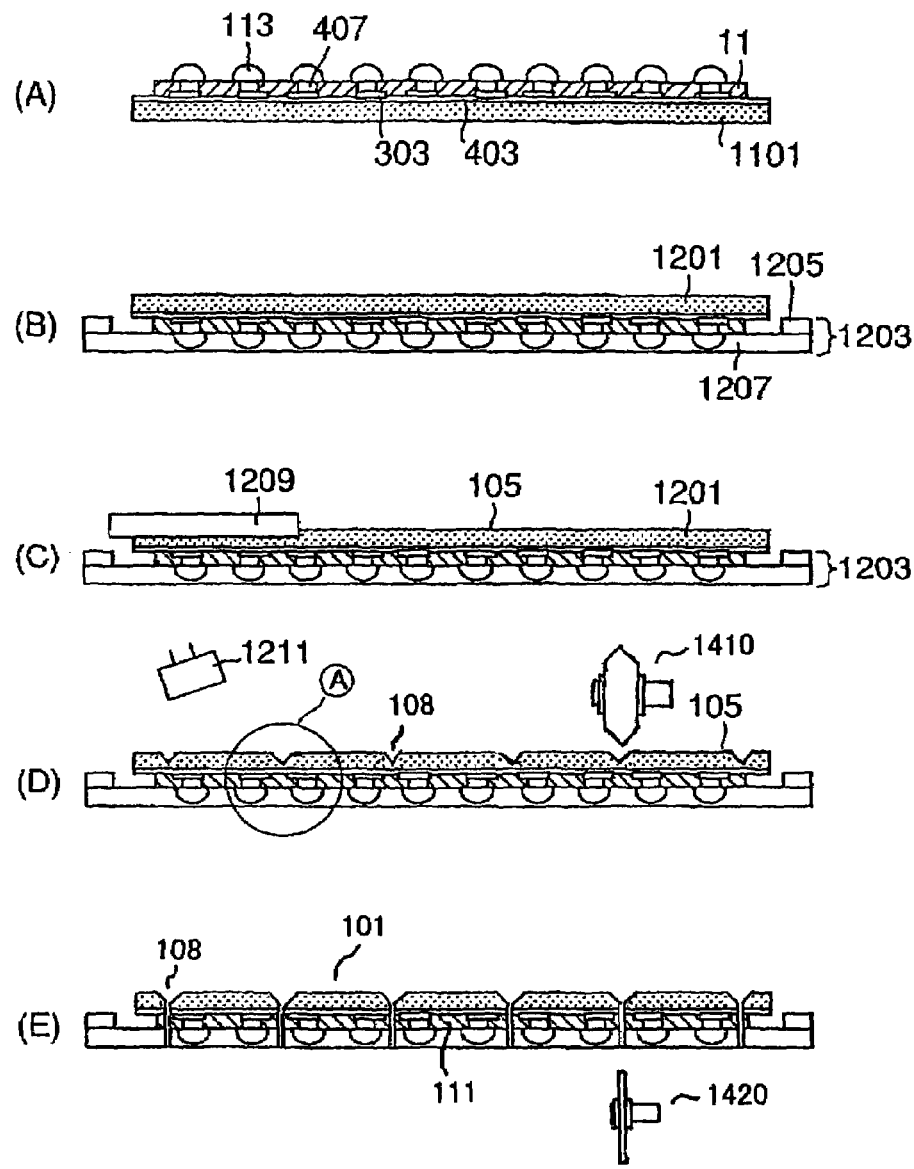
FIG. 16 shows fabrication steps of the semiconductor device 101 according to another embodiment of the present invention.
Figure 17:
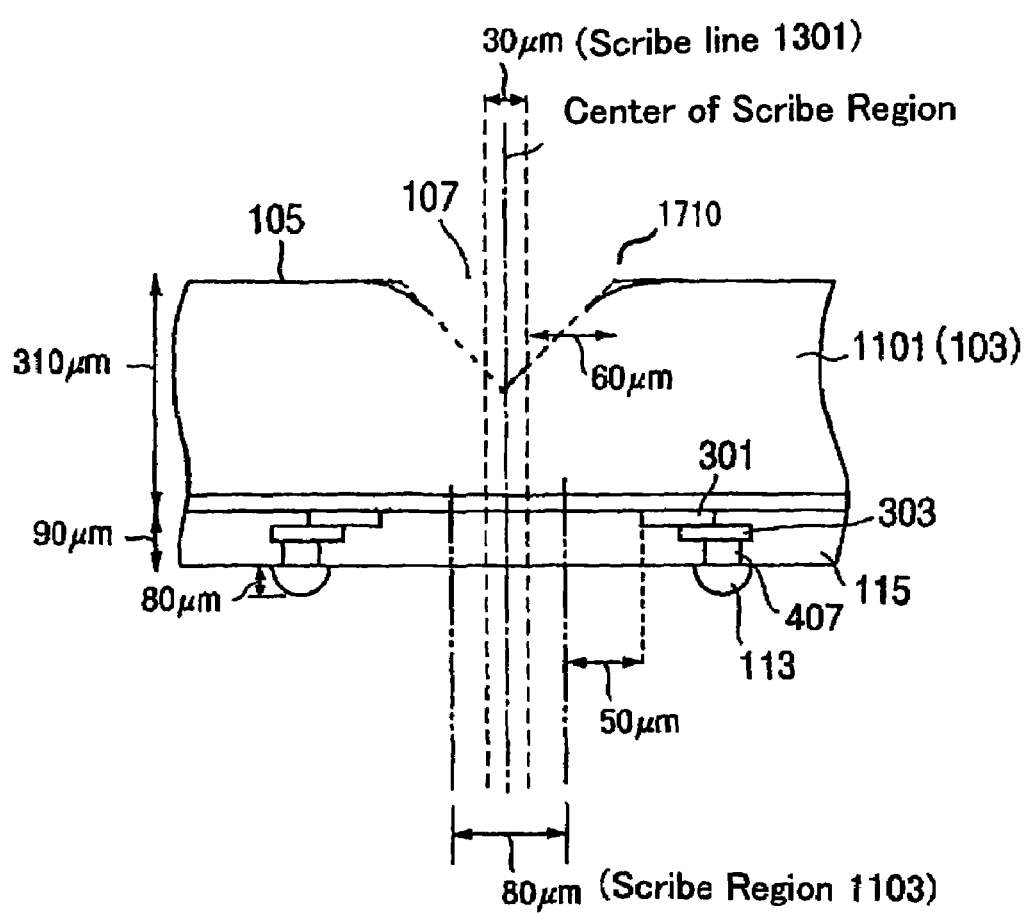
FIG. 17 is a schematic cross-sectional view of another embodiment, corresponding to an encircled region "A" shown in FIG. 12(D).

The semiconductor wafer 1101 may be grinded with the second blade 1420 and separated from a side on which the sealing resin 111 is formed, as shown in FIG. 16(E). In this case, even if the second blade 1420 is slightly shifted from the V-shape groove 108, slippage of the second blade 1420 could be suppressed. Further, as shown in FIG. 17, an edge 1710 of the V-shape groove 108 may be blunted or smoothed. The blunting or smoothing process can be carried out by a wet etching technique.

Figure 18:
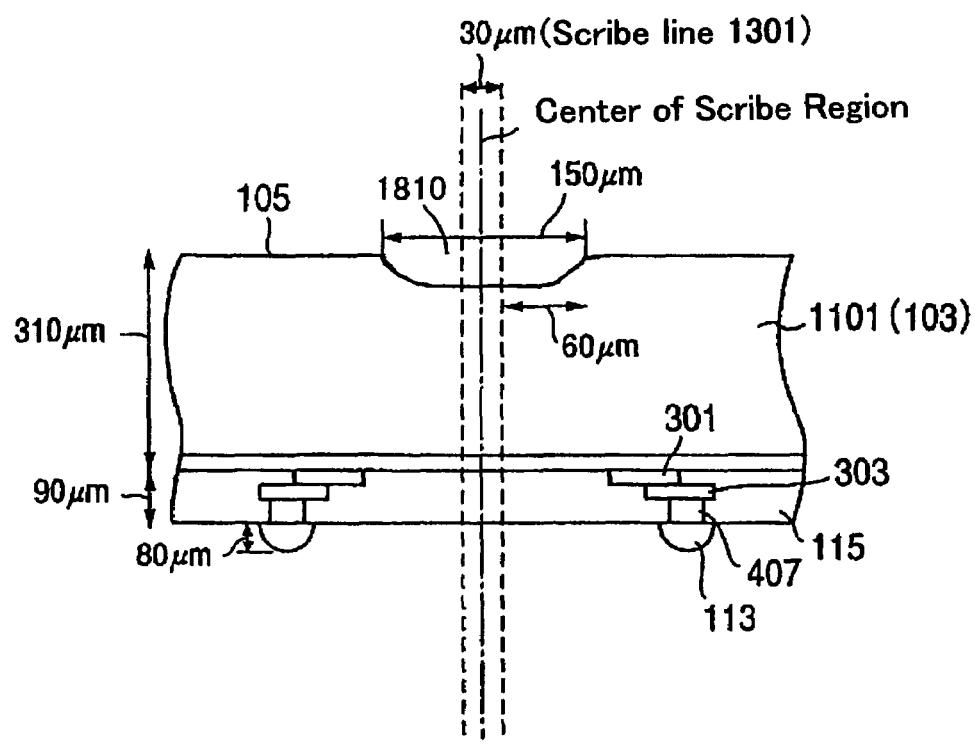
FIG. 18 is a schematic cross-sectional view of another embodiment, corresponding to an encircled region "A" shown in FIG. 12(D).

As shown in FIG. 18, a groove 1810 can be formed by a laser process instead of forming the V-shape groove 108 with the first blade 1410. In the case of forming a groove with a laser, a region of the semiconductor substrate 1101 to which the laser is irradiated is melted, so that a chipping tolerance is improved.

What is claimed is:

1. A method for fabricating a semiconductor device, comprising:
    forming a groove on a second surface of a semiconductor substrate, in which the semiconductor wafer comprises a first surface on which a plurality of semiconductor devices are formed and segmented by a dicing line and a second surface arranged at an opposite side of the first surface, the groove is formed along the dicing line, the groove has a inclined surface with a first width which gets narrower toward the first surface; and
    dicing the semiconductor wafer along the dicing line with a dicing blade having a second width, which is narrower than the first width.

2. A method for fabricating a semiconductor device according to claim 1, wherein
    the groove has a depth that is 15% to 45% of a thickness of the semiconductor wafer.

3. A method for fabricating a semiconductor device according to claim 2, wherein
    the groove is formed with a dicing blade having an inclined surface.

4. A method for fabricating a semiconductor device according to claim 2, wherein
    the groove is formed to have a chamfered surface inclined by substantially 45 degrees to the first surface of the semiconductor wafer.

5. A method for fabricating a semiconductor device according to claim 2, further comprising:
    blunting or smoothing an edge of the groove by an etching process to the second surface of the semiconductor wafer.

6. A method for fabricating a semiconductor device according to claim 5, wherein
    the etching process is a wet etching process.

7. A method for fabricating a semiconductor device according to claim 2, wherein
the dicing process is carried out from the first surface of the semiconductor wafer.

8. A method for fabricating a semiconductor device according to claim 2, wherein
the first surface of the semiconductor wafer is provided with a plurality of electrode pads; a rewiring extending on the first surface and connected at an end to the electrode pad; a post electrode connected to another end of the rewiring; and with a sealing resin which seals the first surface so that a top surface of the post electrode is exposed.

9. A method for fabricating a semiconductor device according to claim 1, wherein
the semiconductor wafer is diced with the dicing blade from the first surface.

10. A method for fabricating a semiconductor device according to claim 1, further comprising:
polishing the second surface of the semiconductor wafer before the groove is formed.

11. A method for fabricating a semiconductor device according to claim 10, wherein
the polishing process is carried out so that the semiconductor wafer has a thickness of 100 to 600 μm(micrometers).

12. A method for fabricating a semiconductor device according to claim 1, further comprising:
etching the second surface of the semiconductor wafer having the groove to blunt or smooth an edge of the groove.

13. A method for fabricating a semiconductor device according to claim 1, wherein
the semiconductor wafer comprises a silicon layer having the first surface and a sapphire layer having the second surface, and wherein
the groove is formed in the sapphire layer.

14. A method for fabricating a semiconductor device according to claim 1, wherein
the groove is formed with a laser beam.

* * * * *